US006180465B1

(12) United States Patent
Gardner et al.

(10) Patent No.: US 6,180,465 B1
(45) Date of Patent: Jan. 30, 2001

(54) METHOD OF MAKING HIGH PERFORMANCE MOSFET WITH CHANNEL SCALING MASK FEATURE

(75) Inventors: Mark I. Gardner, Cedar Creek; Thien Tung Nguyen, Austin, both of TX (US)

(73) Assignee: Advanced Micro Devices, Sunnyvale, CA (US)

( * ) Notice: Under 35 U.S.C. 154(b), the term of this patent shall be extended for 0 days.

(21) Appl. No.: 09/196,853

(22) Filed: Nov. 20, 1998

(51) Int. Cl.[7] .................................................. H01L 21/336
(52) U.S. Cl. ............................................ 438/291; 438/300
(58) Field of Search .............................................. 438/300

(56) References Cited

U.S. PATENT DOCUMENTS

| | | | |
|---|---|---|---|
| 3,528,168 | * | 9/1970 | Adamic . |
| 4,453,305 | * | 6/1984 | Janes et al. . |
| 4,830,975 | * | 5/1989 | Bovaird et al. . |
| 5,083,794 | * | 1/1992 | Pfiester et al. . |
| 5,175,118 | * | 12/1992 | Yoneda . |
| 5,196,357 | * | 3/1993 | Boardman et al. . |
| 5,231,038 | * | 7/1993 | Yamaguchi et al. . |
| 5,270,232 | * | 12/1993 | Kimura et al. . |
| 5,270,257 | * | 12/1993 | Shin . |
| 5,374,575 | * | 12/1994 | Kim et al. . |
| 5,464,782 | * | 11/1995 | Koh . |
| 5,489,543 | * | 2/1996 | Hong . |
| 5,576,574 | * | 11/1996 | Hong . |
| 5,646,056 | * | 7/1997 | Lin et al. . |
| 5,677,210 | * | 10/1997 | Park et al. . |
| 5,872,039 | * | 2/1999 | Imai . |
| 6,015,727 | * | 6/1998 | Wanlass . |

OTHER PUBLICATIONS

Wolf, "Silicon Prcessing for the VLSI Era," vol. 2, pp. 354–356, 1990.*

* cited by examiner

Primary Examiner—John F. Niebling
Assistant Examiner—Jonathan Hack
(74) Attorney, Agent, or Firm—Bruce Garlick; James Harrison

(57) ABSTRACT

A method of forming a transistor includes forming a source/drain implant in the initial processing stages just after the formation of the isolation and active regions on the substrate. A dielectric layer is then formed on the surface of the substrate, portions of which are then etched to define a channel opening for the device. A uniform nitride layer is formed over the surface of the substrate. The nitride layer is then etched to create nitride sidewall spacers. Additionally, the channel region is then etched to remove the doped portions of the active region. A gate dielectric is then formed, the gate dielectric including a nitrogen bearing oxide and a high K material. A gate conductor is then formed upon the high K material. A silicidation step is then performed. In alternative embodiments, the source/drain region is not formed and the source and drain are doped after the gate is complete. In the embodiment, the gate resides upon the active region and etching into the active region is not required. In either case, with the channel opening created to be at a lower lithographic limit, the gate conductor has a width less than the lower lithographic limit.

18 Claims, 6 Drawing Sheets

METHOD OF MAKING HIGH PERFORMANCE MOSFET WITH CHANNEL SCALING MASK FEATURE

BACKGROUND

1. Field of the Invention

The present invention relates generally to integrated circuit manufacture; and more particularly to a method of manufacture and a structure in which a gate conductor is formed in a scaled device that has a width less than that obtainable by a minimum lithographic feature size.

2. Description of the Related Art

The structure and the various components, or features, of a metal oxide semiconductor (MOS) devices are generally well known. A MOS transistor typically includes a substrate material onto which a gate dielectric and a patterned gate conductor are formed. The gate conductor serves to self-align impurities forwarded into the substrate on opposite sides of the gate conductor. The impurities placed into the substrate define a junction region, also known as source and drain regions. The gate conductor is patterned from a layer of polysilicon using various lithography techniques.

A typical n-channel MOS transistor employs N-type junctions placed into a P-type substrate. Conversely, a typical p-channel MOS transistor comprises P-type junctions placed into an N-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both N-type and P-type transistors (i.e., Complementary MOS, "CMOS") are needed.

A common trend in modern integrated circuit manufacture is to produce transistors having feature sizes as small as possible. To achieve a high density integrated circuit, features such as the gate conductors, source and drain junctions, and interconnects to the junctions must be made as small as possible. Many modern day processes employ features which have as small as 0.20 microns critical dimensions. As feature sizes decrease, the size of the resulting transistors as well as the interconnections between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow for higher speed integrated circuits to be constructed that have greater processing capabilities and that produce less heat.

The benefits of high-density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor. In view of these considerations, certain scaling limits are being reached.

Additional problems relate to reducing the channel length in scaled transistors. Because lithography equipment is limited to a smallest dimension, the channel length cannot be made shorter than the smallest dimension. Such channel length limitation has heretofore provided a lower limit on the shortest obtainable channel length. Thus, there exists a need in the art for a method of forming devices that have channel lengths shorter than the limits placed thereupon by lithography equipment.

SUMMARY OF THE INVENTION

The problems outlined above are in large part solved by the transistor formation process according to the present invention in which gate conductors are formed which have widths less than the smallest dimension available using lithography. In such method of formation, a source/drain region may be first doped at a desired level. Then, a dielectric layer is blanked formed across the surface of the substrate and etched to form a channel opening above the source drain region. A nitride layer is then formed on the substrate and partially removed to leave spacers on inner sidewalls of the dielectric layer in the channel opening.

The source/drain region is then removed in an etching step to expose an undoped portion of the active region. Such etching step segregates the source/drain region into a source and a drain. A Vt region may then be formed in the channel region upon the active region. Thereafter, a gate dielectric is formed that includes a thin nitrogen bearing oxide layer and a high K layer. A gate conductor is then formed to create formation of the gate. The oxide layer on both sides of the gate is then partially or fully removed to expose the source and drain. Additional doping and/or annealing may be performed to create formation of the source, drain and LDD regions.

Creation of a transistor in this fashion allows the gate conductor to have a width less than that obtainable in a lithography step. Further, when the gate dielectric extends below a lower portion of the source and drain, short channel effects are reduced or eliminated.

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which.

DETAILED DESCRIPTION OF THE DRAWINGS

Figure 1A:
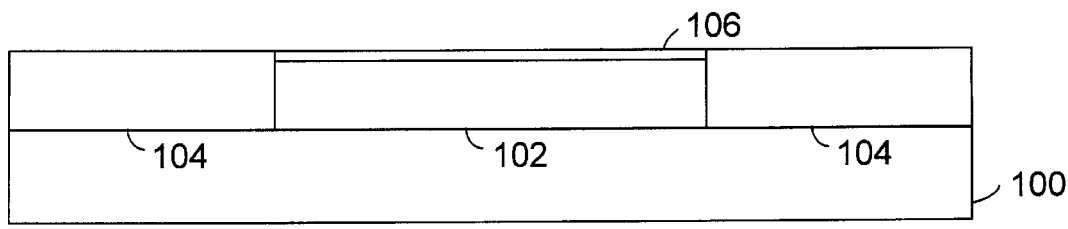
FIGS. 1A through 1D are partial cross-sectional views of a semiconductor substrate illustrating the formation of transistors according to the present invention.

FIGS. 1A through 1D are partial cross-sectional views of a semiconductor substrate illustrating the formation of transistors according to the present invention. Referring now to FIG. 1A, a substrate 100 includes an active region 102 and a plurality of isolation regions 104. In general, FIG. 1A represents a substrate after a first set of steps of the integrated circuit fabrication process as described herein are performed. The active region 102 is a semiconductive region in which an active device may be formed and is one of a number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide. The isolation regions 104 may be formed using the well-known LOCOS growth process, trenching and filling steps or another isolation process. In general, the invention herein includes all forms of creating isolation regions.

Continuing to refer to FIG. 1A, it may be seen that a dopant has been implanted into the active region 102 of substrate 100 so as to form a shallow source/drain region 106. The implantation of the dopant is performed at an energy level to only partially penetrate active region 102. Resultantly, the source/drain region 106 is shallow and does not extend to the full depth of the active region 102 or to the depth of the isolation regions 104. In order to achieve the shallow doping of the dopant, it is implanted with an energy of 2 to 10 Kev and with a dose of 8×10e15 ions/cm2. In the described embodiment of the invention, the dopant is arsenic and the active region 102 is formed of a P-type material. Thus, the described structure will form NMOS devices. The arsenic is, in the embodiment, implanted to a depth of 200 Angstroms. Alternatively, the doping may be performed with an dose of 2×10e14 to 8×10e14 ions/cm2 to achieve a lighter doping level. In such case, as will be described further herein, the dopant serves to commence formation of lightly doped drain (LDD) regions.

For P-type devices, the active region 102 is N-type and the dopant is boron. The boron with the implantation of the boron performed at the implant and concentration levels specified above. In such case, the Boron is implanted into an N-type substrate 100 or in an N-well formed in a P-type substrate. Optionally, and after the active region 102 is doped, the surface of the active region 102 may be subjected to a silicidation step using standard techniques to improve the bulk conductivity of the surface of the active region 102.

Figure 1B:
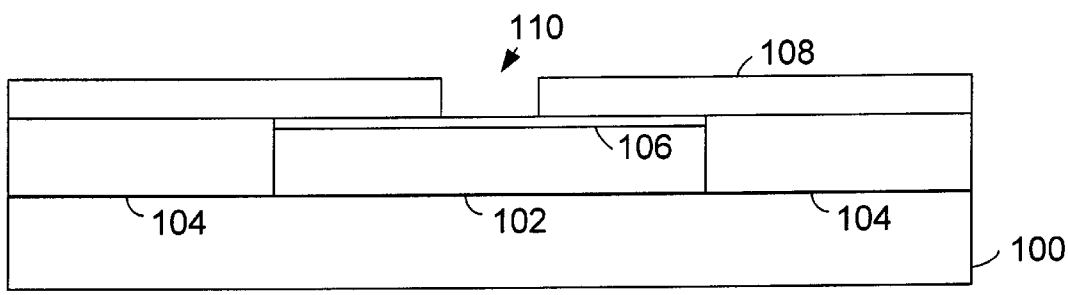

Referring now to FIG. 1B, after the formation of the source/drain region 106, a dielectric layer 108 is deposited across the surface of the substrate 100. In the described embodiment, the dielectric layer 108 is formed of silicon dioxide and is sufficiently thick so that it may form spacers in a subsequent point in the process. In other embodiments, however, the dielectric layer 108 may be formed of other materials as well that do not react with the source/drain region 106. In the described embodiment, the dielectric layer 108 is formed to a thickness of between 1000 and 2000 Angstroms.

After the dielectric layer 108 is formed, a patterned mask is formed on top of dielectric layer 108 and the dielectric layer is anisotropically etched to form a channel opening 110. In one embodiment, the patterned mask 132 is formed by depositing a photoresist across the exposed surface of the dielectric layer 108 and exposing the photoresist photolithography step. Then, the exposed portions of the photoresist are stripped in an ashing process. Of course, the patterned mask 132 may be formed using other techniques as well. Once the patterned mask is formed (not shown herein), the unprotected portion of the dielectric layer is anisotropically etched to the source/drain region 106 as may be seen in FIG. 1B. The width of the channel opening 110 after the etching process is, in the described embodiment, approximately 2000 Angstroms (which corresponds, in the present embodiment, to a minimum size obtainable in the lithography step used to pattern the patterned mask). FIG. 1B shows the substrate after the patterned mask has been stripped to expose the dielectric layer 108 and the channel opening 110 which extends to the source/drain region 106.

Figure 1C:
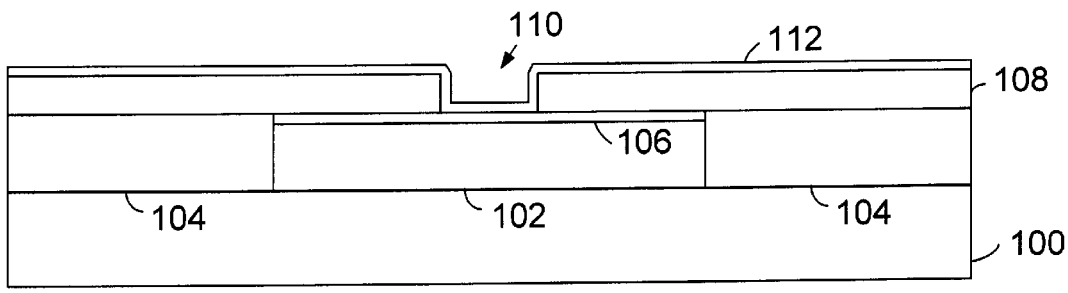

Referring now to FIG. 1C, it may be seen that a nitride layer 112 has been deposited onto substrate 100. The nitride layer 112 is deposited to a sufficient depth and in a manner to cause the nitride to adhere to the sides of the dielectric layer 108 that were formed during creation of the channel opening 110. In the described embodiment, the nitride layer 112 adhering to the sides of the dielectric layer 108 in the channel opening 110 has a thickness of approximately 600 Angstroms thick. Thus, the portion of the channel opening 110 has been reduced to a width of approximately 800 Angstroms. It is noteworthy that the width of the channel opening 110 has now been reduced to approximately 40 percent of the minimum dimension obtainable by the photolithography step employed to form the channel opening 110.

Figure 1D:
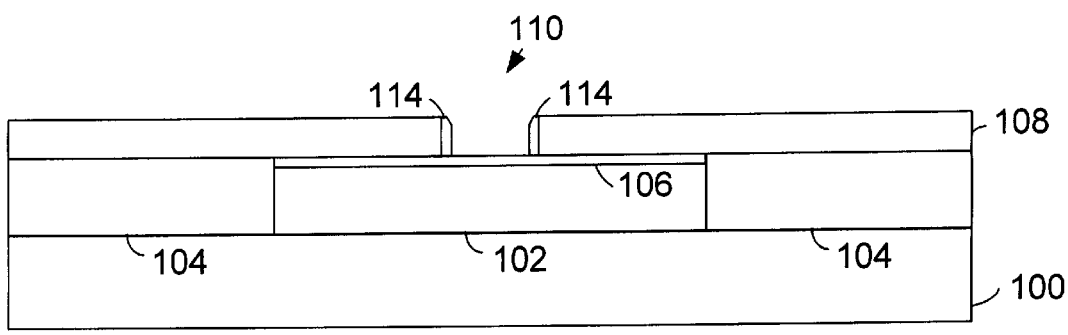

Referring now to FIG. 1D, it may be seen that the nitride layer 112 has been etched to remove the portions that previously resided upon the dielectric layer 108 and most portions that previously resided on the surface of the source/drain region 106 of the active region 102 within the channel opening 110. The result of this processing is the formation of the nitride spacers 114.

Figure 2A:
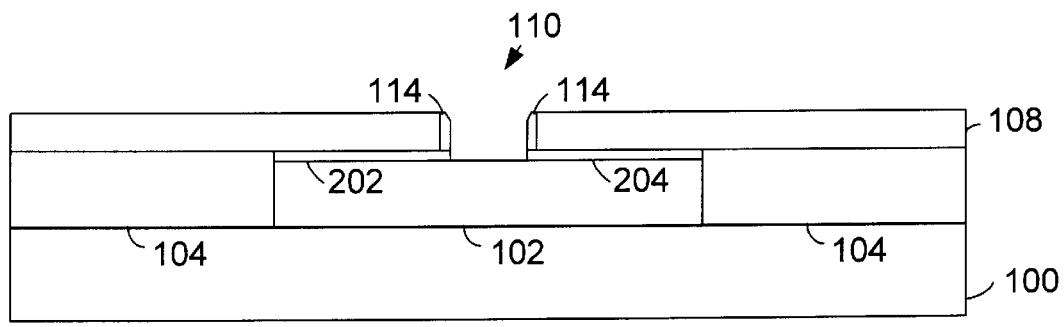
FIGS. 2A through 2D are partial cross sectional views of the semiconductor substrate of FIGS. 1A through 1D illustrating the formation of transistors according to the present invention during subsequent formation steps.

FIGS. 2A through 2D are partial cross sectional views of the semiconductor substrate of FIGS. 1A through 1D illustrating the formation of transistors according to the present invention during subsequent formation steps. Referring now to FIG. 2A, it may be seen that the doped portion of the active region 102 (the source/drain region 106 that previously resided below the channel opening 110) has been etched so as to expose an undoped portion of active region 102. Based upon the depth of the source/drain region 106 doping, the minimum depth of the etched away portion is between 200 and 300 Angstroms. In general, the active region 102 is etched to a depth that is sufficient to remove the doped portion of the active region in the channel opening 110 so as to expose an undoped portion of the active region 102. Accordingly, if the doping is lighter and performed with a lower implant energy, the etched depth is less. One effect of etching the doped portion to reach the exposed undoped portion is to partition the doped source/drain region 106 into separate source 202 and drain 204.

Figure 2B:
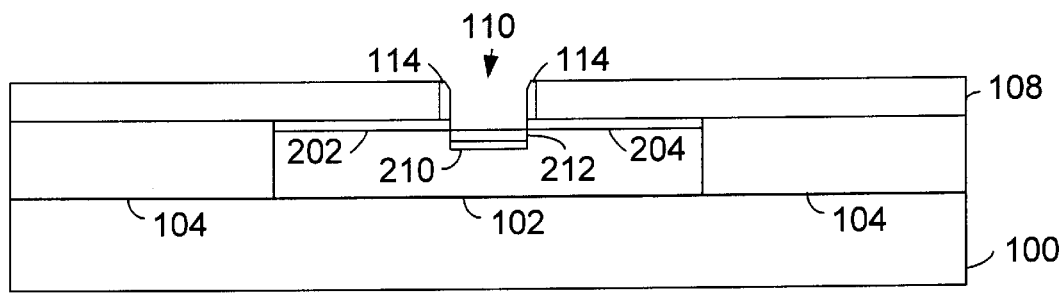

Referring now to FIG. 2B, it may be seen that a Vt implant 210 has been formed in the exposed and undoped portion of active region 102 to set the threshold voltage of the resulting transistor. Further, FIG. 2B illustrates a nitrogen bearing oxide layer 212 that has been formed on top of the Vt implant 210. In the present embodiment, the nitrogen bearing oxide layer 212 is deposited to a depth of 15 to 25 Angstroms and then slow etched back to a depth of 3 to 8 Angstroms. Resultantly, the nitrogen bearing oxide layer 212 forms a thin gate dielectric in the channel opening 110 above the Vt implant region 210.

Figure 2C:
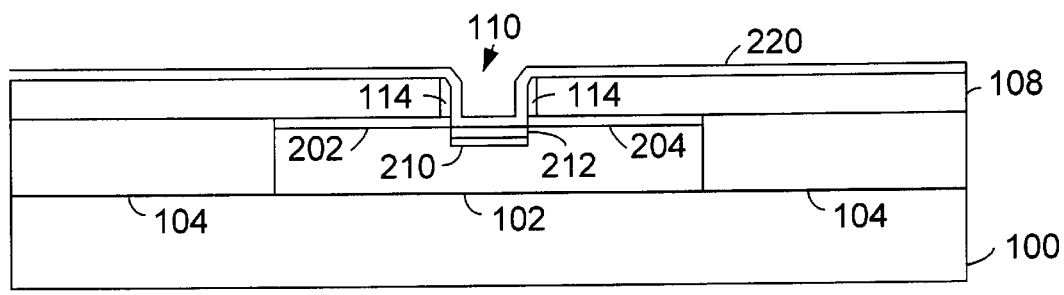

Referring now to FIG. 2C, a high K material layer is shown as having been deposited on top of substrate 100 and within the channel opening 110 upon the nitrogen bearing oxide layer 212 to create a high K material layer 220. In the described embodiment of the invention, the high K material layer 220 is formed of $Ta_2O_5$ or of Barium Strontium Titanate (BST) The $Ta_2O_5$ has a K value that is equal to 25. The BST has a K value that is equal to 160. By way of example, the high K material layer 220 is deposited so as to have an effective thickness equal to four Angstroms of silicon dioxide (K=4). In such example, a $Ta_2O_5$ layer is deposited to a thickness of approximately [4*(25/4)=] 25 Angstrom. Further, in such case, using BST instead of $Ta_2O_5$, the BST layer is deposited to have a thickness equal to approximately [4*(160/4) =] 160 Angstroms.

Figure 2D:
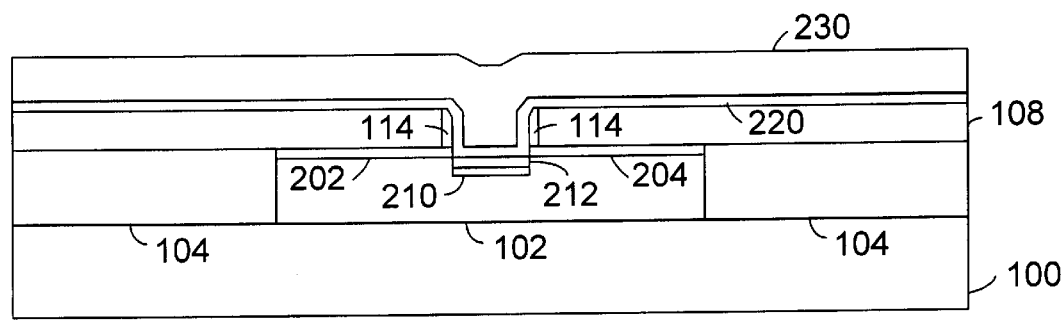

Referring now to FIG. 2D, it may be seen that a gate conductor layer 230 has been deposited upon the substrate 100. The gate conductor layer 230 is formed of either a polysilicon (that is subsequently doped to make it conductive) or of a metal. In the described embodiment of the invention, the polysilicon gate conductor layer 230 may be deposited in a Low Pressure Chemical Vapor Deposition (LPCVD) step or another step that is known in the art. In the described embodiment, polysilicon gate conductor layer 230 is formed to have a depth or thickness of 500 to 1500 Angstroms.

After the gate conductor layer 230 is formed, the substrate is subjected to a chemical-mechanical polish ("CMP") process. CMP is a well-known interlevel removal process used for its ability to planarize the resulting surface. CMP combines chemical etching and mechanical buffing to remove raised features on a surface of a semiconductor wafer. In a typical CMP process, a semiconductor wafer is mounted on a rotating holder and lowered onto a rotating surface flooded with a mild etching solution, generally defined as a silica slurry. The etching grows a thin layer on the exposed wafer surface that is almost simultaneously removed by the buffing action. The net effect is a very controlled polishing process capable of almost complete flatness.

Figure 3A:
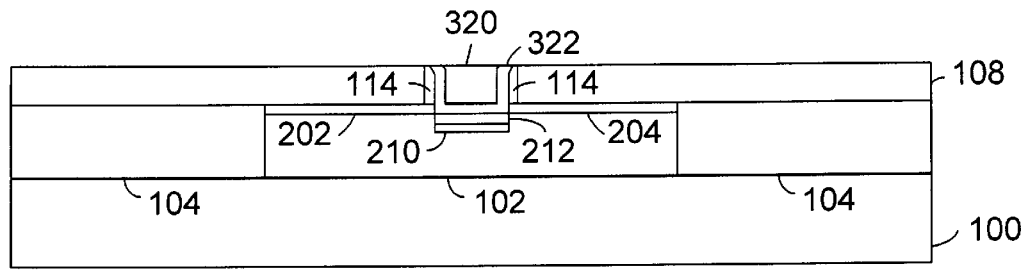
FIGS. 3A through 3D are partial cross sectional views of the semiconductor substrate of FIGS. 2A through 2D illustrating the formation of transistors according to the present invention during subsequent formation steps.

FIGS. 3A through 3D are partial cross sectional views of the semiconductor substrate of FIGS. 2A through 2D illustrating the formation of transistors according to the present invention during subsequent formation steps and in differing embodiments. Referring now to FIG. 3A, substrate 100 has been polished in a CMP process so as to remove gate conductor layer 230 from the substrate to the point that the only remaining portion of the gate conductor layer 230 is that which is within the channel opening 110 of FIG. 2C that forms a gate conductor 320. As may be seen, the gate conductor layer 230 no longer exists above dielectric layer 108. Moreover, the high K material formed above the dielectric layer 108 also has been removed from the surface of the dielectric layer 108 during the CMP process. As is noted, the width of the gate conductor 320 has been reduced from the initial width of the channel opening of approximately 2000 Angstroms by the width of the spacers 114 and a thickness of the high K material 322 that adhered to the sides of the spacers 322. Depending upon the thickness of the high K material 322 on the sidewalls, the width of the gate conductor 320 may be substantially less than 2000 Angstroms (the lithography limit).

Figure 3B:
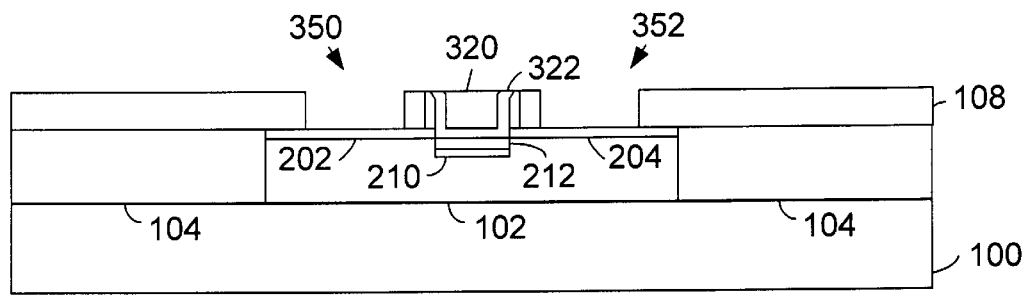

Referring now to FIG. 3B, substrate 100 is shown after an anisotropic etch has been performed to remove portions of the dielectric layer 108 above the source 202 and drain 204. The anisotropic etch is performed to remove a portion of the dielectric layer 108 on both sides of the gate above the lightly doped portion that open the dielectric layer 108 above the source 202 and drain 204. Such etching requires the formation of a patterned mask, an anisotropic etch step and subsequent removal of remaining portions of the patterned mask.

Figure 3C:
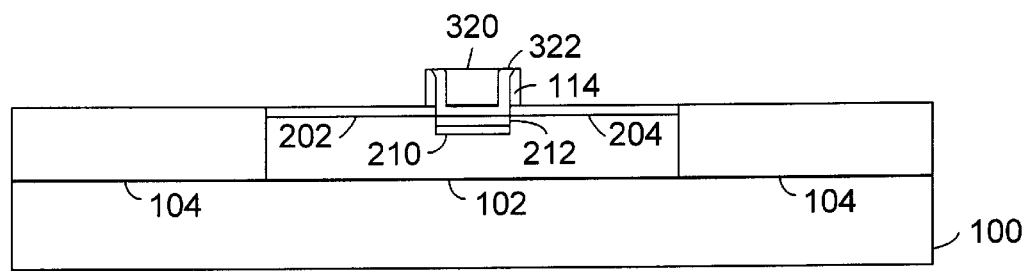

FIG. 3C illustrates an alternate construction in which the dielectric layer 108 is fully removed from the surface of the substrate 100. Once the source 202 and drain 202 regions have been properly doped and the LDD regions have been defined, the remaining portions of the dielectric layer 108 may be removed in any known manner that is directed to removing the dielectric layer 108 without damage to the gate stack or the doped source/drain regions 202 and 204 of substrate 100.

Figure 3D:
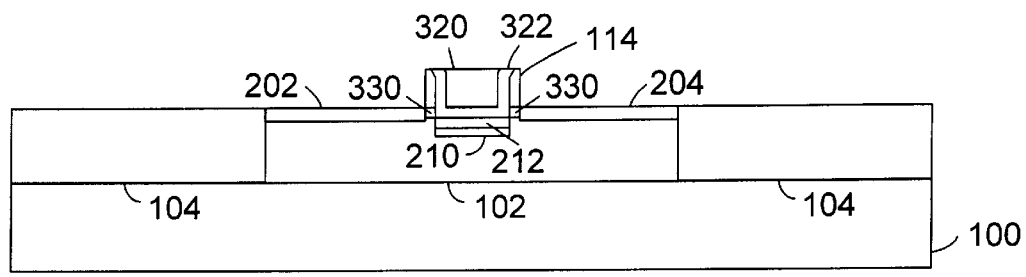

FIG. 3D illustrates the structure of FIG. 3D after the source 202 and drain 204 regions have been doped an additional amount, as discussed above, and the remaining portions of the dielectric layer 108 have been removed. As a result, the source 202 and drain 204 that remain under the spacers 114 become the LDD regions 330.

In other embodiments, however, alternative processes may also be used to form the LDD regions 330. For example, in an alternate embodiment of the invention, the LDD regions 330 may be formed by an annealing step wherein some of the impurities of the source 202 and drain 204 regions migrate into the channel portion of active region 102 to form the LDD regions 330.

In an alternate construction of a transistor according to the present invention, the source/drain region 106 is not formed. Thus, etching of the active region 102 is not required to remove the source/drain region 106 in the channel opening 110. In such case, the gate dielectric (nitrogen bearing oxide layer 212 and/or high K material layer 220) are formed upon the surface of the active region 102 and the source 202 and drain 204 are doped after the formation of the gate stack (Vt region 210, gate insulator 212 and 322 and gate conductor 320). However, even in this alternate embodiment, the width of the gate conductor 320 is less than the width of the channel opening 110 (that was formed at the lower lithographic limit).

Figure 4:
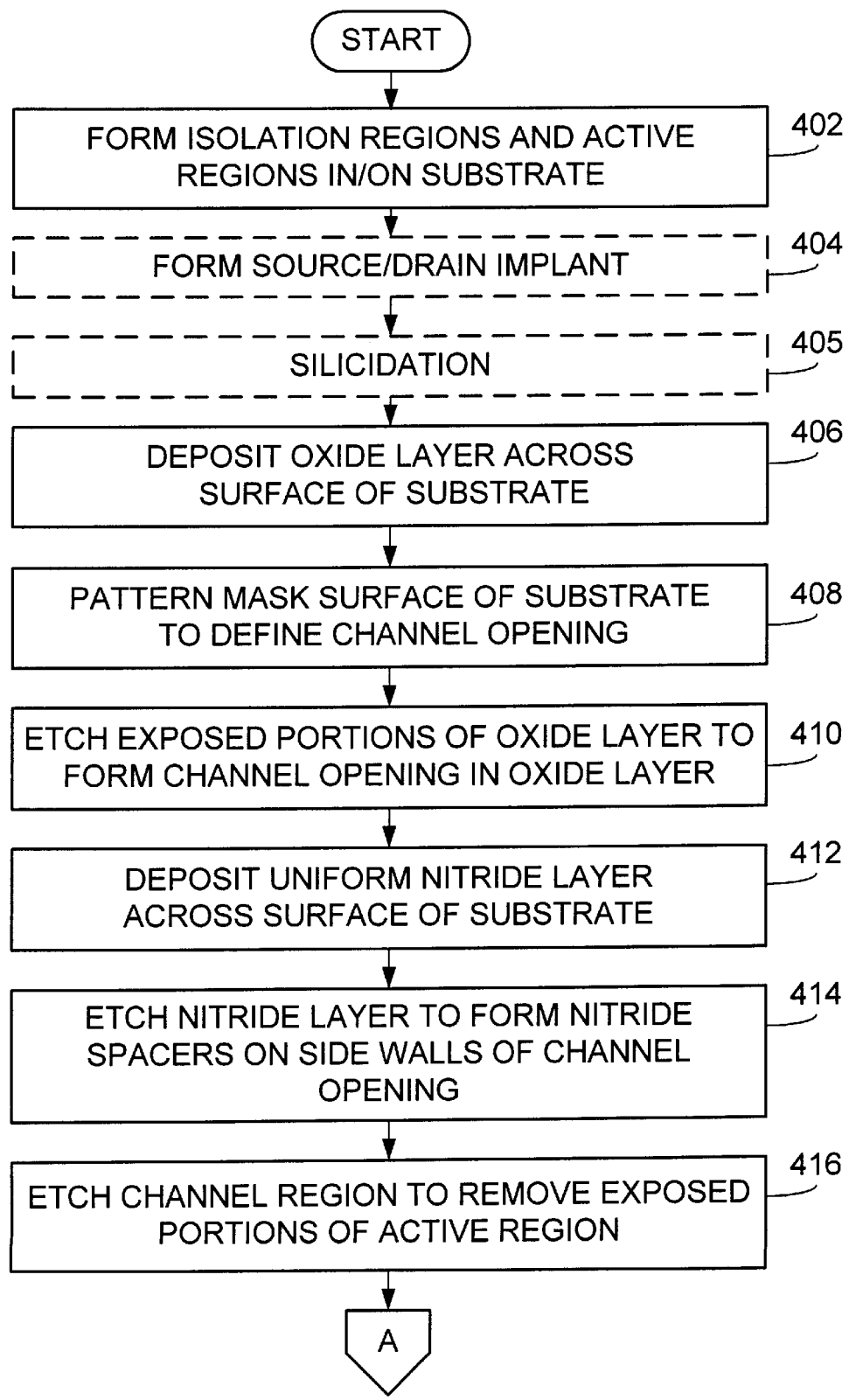
FIG. 4 is a flow chart illustrating a first series of steps of a method for forming a transistor upon a semiconductor substrate according to the present invention.
Figure 5:
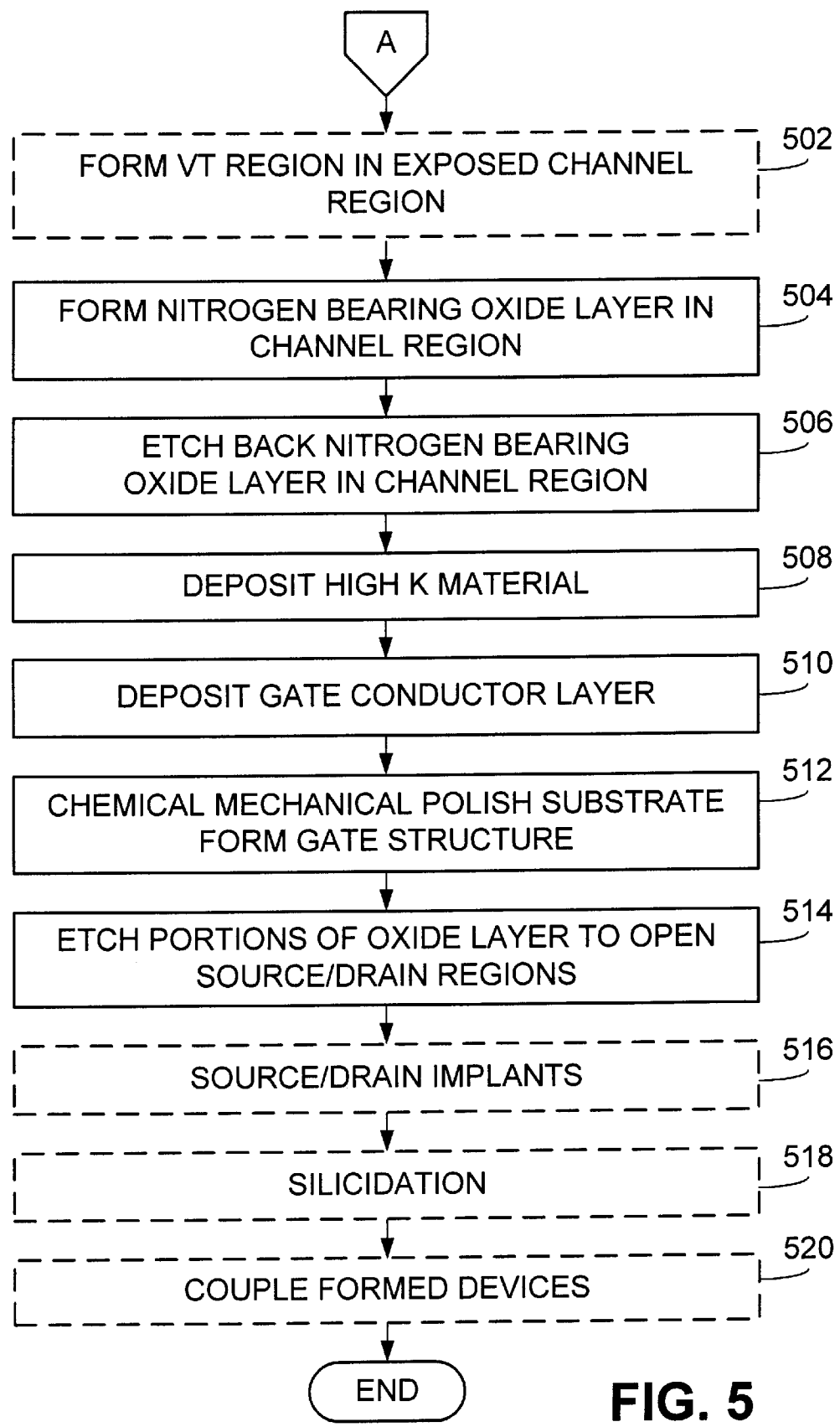
FIG. 5 is a flow chart illustrating a second series of steps of a method for forming a transistor upon a semiconductor substrate according to the present invention.

FIG. 4 is a flow chart illustrating a first series of steps of a method for forming a transistor upon a semiconductor substrate according to the present invention. In FIGS. 4 and 5, a process for forming an NMOS device in a P-type substrate is described (or in a P-type well formed in an N-type substrate). As is known, the process of forming a PMOS device in a N-type substrate (or in an N-type well formed in a P-type substrate) may be accomplished using similar steps but with different doping types. Referring now to FIG. 4, isolation regions 104 and active regions 102 are formed in/on the substrate 100 of FIGS. 1A–1D (step 402). The active region 102 is a semiconductive region in which an active device may be formed and is one of a great number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide. The isolation regions 104 may be formed using the well-known LOCOS growth process, trenching and filling steps or another isolation process. In general, the invention herein includes all forms of creating isolation regions.

Ad Continuing to refer to FIG. 4, a dopant is optionally implanted into the active region 102 of substrate 100 so as to form a shallow source/drain region 106 (step 404). The dopant is implanted at an energy level to only partially penetrate active region 102. Resultantly, the source/drain region 106 is shallow and does not extend to the full depth of the active region 102 or to the depth of the isolation regions 104 as may be seen in FIG. 1. In order to achieve the shallow doping of the dopant, it is implanted with an energy of 2 to 10 Kev and with a dose of 2×10e15 to 8×10 e15 ions/cm2. In the described embodiment of the invention, the dopant is arsenic and the active region 102 is formed of an P-type material. The arsenic is implanted to a depth of 200 to 300 Angstroms. Alternatively, the doping may be performed with a dose of 2×10e14 to 8×10e14 ions/cm2 to achieve a lighter doping level.

In forming a PMOS device in an N-type substrate or well, boron may be used as the dopant with the implant energy and dose being substantially the same as the levels specified above. Optionally, and after the active region is doped, the surface of the active region may be subjected to a silicidation step (optional step 405) using standard techniques to improve connectivity at a later point in the wafer fabrication process.

After the formation of the source/drain region 106, a dielectric layer 108 is grown or deposited on top of active and isolation regions 102 and 104 (step 406). In the described embodiment, the dielectric layer 108 is formed of silicon dioxide and is sufficiently thick to assist in forming spacers at a later point in the process. A range of such thickness is 1000 to 2000 Angstroms. In other embodiments, the dielectric 108 can be formed of other materials.

A patterned mask 132 is then formed on top of dielectric layer 108 to define a channel opening 110 using a photolithography step (step 408). Currently, the smallest size possible is approximately 2000 Angstroms. Once the patterned mask is formed (not shown herein), the unprotected portion of the dielectric layer 108 is etched to the source/drain region 106 as may be seen in FIG. 1B to form the channel opening 110 (step 410). After the unprotected portions of the dielectric layer are etched away, a nitride layer 112 is deposited (step 412). The nitride layer 112 is deposited to cause the nitride to adhere to the inner walls of the dielectric layer 108 in the channel opening 110 that was defined by the previously described etching process. In the described embodiment herein, the nitride layer adheres to the sides of the dielectric layer to a thickness of approximately 600 Angstroms leaving a channel opening 110 that is approximately 800 Angstroms thick. When deposited, the nitride layer 112 on the sidewalls of the dielectric layer 108 has a height equal to the height of the sidewalls.

Continuing to refer to FIG. 4, the nitride layer 112 is isotropically etched to remove those portions of the nitride layer 112 that reside upon the dielectric layer 108 and those portions that reside upon the source/drain region 106 in the channel opening 110 (step 414) but not to remove those portions of the nitride layer 110 adhering to the sidewalls of the dielectric layer 108 adjacent the channel opening 110. The result of this processing is the formation of spacers 114 as shown in FIG. 1D. These spacers 114 have a height substantially equal to the thickness of the dielectric layer 108.

The source/drain region 106 in the channel opening 110 is removed in an etch step to expose an undoped portion of active region 102 (step 416). In such step, between 200 and 300 Angstroms of the active region 102 is removed so as to extend below the source/drain region 106 in the channel opening 110. The etching depth must be sufficient to remove the source/drain region 106 of the active region 102 in the channel opening 110 to expose the undoped portion of the active region 102. Accordingly, if the doping is lighter and performed with a lower implant energy, the required etching depth is less. One result of etching the source/drain region 106 in the channel opening 110 is to partition the doped source/drain region 106 into separate source 202 and drain 204.

FIG. 5 is a flow chart illustrating a second series of steps of a method for forming a transistor upon a semiconductor substrate according to the present invention. Referring now to FIG. 5, a Vt implant region 210 is formed in the exposed and undoped portion of active region 102 in the channel opening 100 to set the threshold voltage of the transistor (step 502). Additionally, a nitrogen bearing oxide layer 212 is deposited on top of Vt implant region 210 (step 504) to a thickness of between 15 and 25 Angstroms.

After the nitrogen bearing oxide layer 212 is formed, it is etched back in a slow etch process to a thickness of 3 to 8 Angstroms (step 506). Such slow etch process may employ a vapor mist of hydrogen fluoride (HF) that has been diluted with water at a ratio of 100 parts water to one part HF. By employing the slow etch process, a tight tolerance is achieved and the nitrogen bearing oxide layer 212 may be etched to a desired thickness within a small margin.

Thereafter, a high K material layer 112 is deposited on top of substrate 100 (step 508). In the described embodiment of the invention, the high K layer 112 has an equivalent thickness of 4 Angstroms of silicon dioxide. As was previously described, therefore, the actual thickness of the high K layer 112 varies, depending upon the material used, e.g., $Ta_2O_5$, Barium Strontium Titanate, etc. In such case, a $Ta_2O_5$ layer will have a thickness equal to approximately 25 Angstroms while a Barium Strontium Titanate layer will have a thickness of approximately 160 Angstroms.

Continuing to refer to FIG. 5, a gate conductor layer 230 is formed on top of substrate 100 (step 510). The gate conductor layer 230 is formed of either a doped polysilicon or of a metal. In one embodiment of the invention, the polysilicon layer 120 is deposited on top of and across the dielectric layer 106 and then doped. The polysilicon layer 120 may be deposited in a Low Pressure Chemical Vapor Deposition (LPCVD) step or another step that is known in the art. In the described embodiment, polysilicon layer 120 is formed to have a depth or thickness of 500 to 1500 Angstroms.

After the gate conductor layer 230 is formed upon the substrate 100, the structure is subjected to a CMP process (step 512). Here, the CMP process is performed upon the gate conductor layer 230 to remove it from the substrate to the point that the only remaining gate conductor layer 230 is that which is within the portion 110 of FIG. 2C. As may be seen, the gate conductor layer 230 no longer exists above dielectric layer 108. Moreover, the high K material formed above dielectric layer 108 also has been removed during the CMP.

Thereafter, an anisotropic etch is performed to remove all or portions of dielectric layer 108 (step 514) to expose the source 202 and drain 204. The anisotropic etch removes all or a portion of the oxide layer 108 on both sides of the gate above the source 202 and drain region 204. Such removal process produces the structure illustrated in FIG. 3C. Alternatively, the dielectric layer may be pattern masked and etched to create openings to the source 202 and drain. This structure is illustrated in FIG. 3C.

Next, source 202 and drain 204 may be doped an additional amount so as to set the doping to a desired level (step 516) if it was not previously set at the desired level. The proper doping levels are known by those skilled in the art and are defined by the particular design. As a result, the portion of the substrate that remains under the unetched portions of oxide layer 108 (if any) and the spacers will be undoped in this additional step and will retain the prior doping level (if prior doping was performed).

Next, if the source 202 and drain 204 were not previously subjected to a silicidation step, they may be subjected to such silicidation step (step 518). Accordingly, the final step is to connect the formed devices according to a circuit design to create an integrated circuit (step 520).

Figure 6:
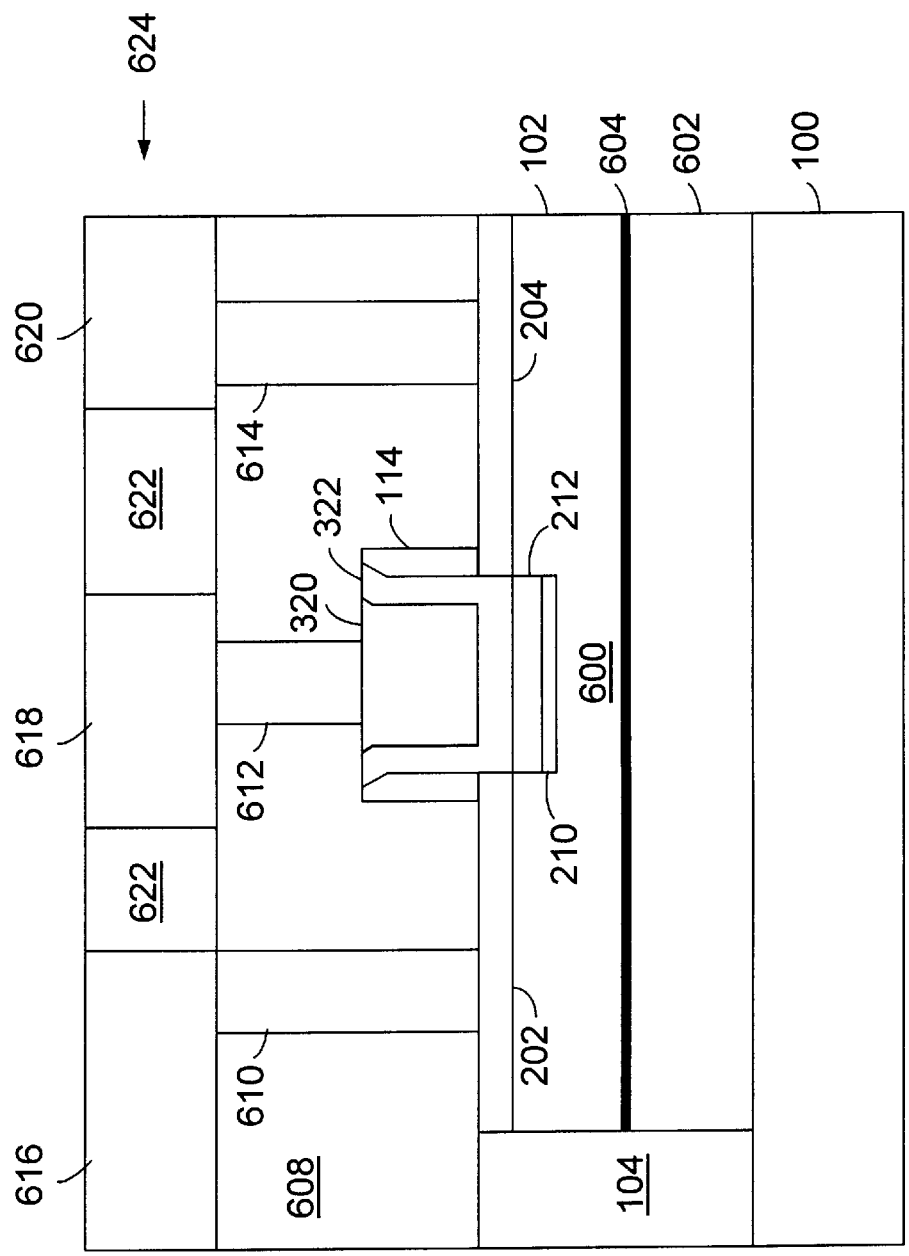
FIG. 6 is a partial cross sectional diagram of a transistor that has been formed according to the present invention that illustrates in detail the components of the transistor and how the transistor can be connected to other transistors to form an integrated circuit.

FIG. 6 is a partial cross sectional diagram of a transistor which has been formed according to the present invention and that illustrates in detail the components of the transistor and how the transistor can be connected to other transistors to form an integrated circuit. Referring now to FIG. 6, each of the components as discussed previously include the part numbers used to introduce the components. Vt region 210 is shown as formed under the nitrogen bearing oxide layer 212. Residing below the Vt region 210 is the channel 600 of the transistor. Note that the source 202 and drain 204 reside in a position above the Vt region 210, the nitrogen bearing oxide layer 212 and the channel 600. Such a construction causes the channel 600 to have enhanced protection against problems normally associated with short channels of scaled transistors. Also shown are a well 602 and a punchthrough region 604. As is evident, the transistor structure of FIG. 3C is shown in FIG. 6. Thus, no separate LDD regions are shown.

In coupling the transistor to other transistors and other devices in an integrated circuit, an insulation layer 608 is formed in a CVD process upon the transistor and other portions of the substrate at a thickness that is required to isolate a first metallization layer 624 of the device of FIG. 6 from transistors and other devices of the integrated circuit. Typically, the insulation layer 608 is polished in a CMP process to form a planar upper surface. It is then masked and etched to form openings to the active regions of the transistors (e.g., source 202, drain 204 and gate conductor 320).

Once the openings are formed, a sputtering, deposition or evaporation process, by way of example, is used to fill the vias with a metal. The resulting metallized vias 610, 612 and 614 are formed. Metals that can be used in this process include Ti, TiN, W and Al. The vias 610, 612 and 614 may be deposited in a same step that forms metallization layer 624. The metallization layer 624 is then masked to form a conductor pattern and is etched back to the insulation layer 608 to form the conductors 616, 618 and 620. An insulation layer 622 may be formed to isolate conductive paths 616, 618 and 620 formed in the metallization layer 624, particularly if a subsequent metallization layer is formed upon the metallization layer 624. Subsequent metallization layers (not shown) can provide further interconnections among the devices and external to the formed integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a scaled transistor on a substrate, the method comprising:

forming a trench around an active region in the substrate;

filling the trench with a dielectric material to isolate the active region;

doping the active region to form a source/drain region in an upper portion of the active region;

forming a thick dielectric layer across the surface of the substrate;

forming a channel opening in the thick dielectric layer above a central portion of the source/drain region, the channel opening extending to the surface of the source/drain region and including a plurality of sidewalls;

forming a thin dielectric layer across the surface of the substrate;

etching the thin dielectric layer to remove portions of the thin dielectric layer residing upon the thick dielectric layer and to form spacers upon the plurality of sidewalls of the dielectric layer in the channel opening, the spacers residing upon the source/drain region such that the area of the channel opening is reduced;

removing a portion of the source/drain region corresponding to the channel opening to extend the channel opening past the source/drain region into an undoped portion of the active region, the channel opening as extended segregating the source/drain region to form a source and a drain;

forming a first gate dielectric layer in the channel opening, wherein a lower surface of the first gate dielectric layer in the channel opening resides below a lower surface of the source/drain region;

forming a second dielectric layer across the surface of the substrate such that the second dielectric layer forms a second gate dielectric layer residing upon the first gate dielectric layer and also forms second spacers that reside upon the first spacers so that the area of the channel opening is again reduced;

forming a gate conductor upon the second gate dielectric layer in the channel opening; and removing portions of the thick dielectric layer to expose the source and the drain.

2. The method of claim 1, further comprising forming a Vt region in the active region accessed via the channel opening prior to forming the first gate dielectric.

3. The method of claim 1, wherein:

the source/drain region is formed to a depth of between 200 Angstroms and 300 Angstroms; and the step of removing a portion of the source/drain region includes etching through the source/drain region to the active region.

4. The method of claim 1, wherein forming the first gate dielectric layer includes forming nitrogen bearing oxide layer.

5. The method of claim 4, wherein forming the nitrogen bearing oxide layer includes:

depositing the nitrogen bearing oxide layer to a deposited thickness; and etching the nitrogen bearing oxide layer to a final thickness, wherein the final thickness is less than the deposited thickness.

6. The method of claim 4, wherein forming the second gate dielectric further comprises forming a high K material layer upon the nitrogen bearing oxide layer.

7. The method of claim 1, wherein the step of forming the source/drain region includes doping the active region with a dopant at an implant energy of between 2 Kev and 10 Kev.

8. The method of claim 7, wherein the step of forming the source/drain region includes doping the active region with a dose of between $2 \times 10e15$ and $8 \times 10e15$ ions/cm$^2$.

9. The method of claim 1, further comprising the step of, after removing portions of the thick dielectric layer, further doping the source and drain to a desired doping level.

10. The method of claim 1, further comprising silicidating the source and the drain.

11. The method of claim 1, further comprising:

forming a plurality of transistors according to the previous steps; and intercoupling the plurality of transistors to form an integrated circuit.

12. The method of claim 1, wherein the step of forming a channel opening in the dielectric layer includes:

forming a patterned mask on top of the thick dielectric layer; and removing unmasked portions of the thick dielectric layer.

13. The method of claim 1, wherein the step of forming spacers upon the plurality of sidewalls of the dielectric layer in the channel opening includes:

forming a nitride layer across the substrate; and etching the nitride layer to remove the nitride layer from a top surface of the thick dielectric layer and from the surface of the source/drain region in the channel opening.

14. The method of claim 1, wherein the channel opening is formed to have a width equal to a lithography limit.

15. The method of claim 1, wherein the spacers and the second spacers are formed so that the width of the gate conductor is less than the lithography limit.

16. The method of claim 1, wherein the thick dielectric layer is formed to a thickness of between 1000 and 2000 Angstroms and corresponds to a height of the spacers.

17. The method of claim 1, wherein, when the channel opening is extended past the source/drain region into an undoped portion of the active region, sidewalls of the channel opening are formed of the spacers, a side of the source, a side of the drain.

18. The method of claim 2, wherein portions of the active region also form portions of the sidewalls of the channel opening.

* * * * *